(12) United States Patent
Berglund

(10) Patent No.: US 9,921,330 B2
(45) Date of Patent: Mar. 20, 2018

(54) HIGH POWER CURRENT SWITCH

(71) Applicant: Advanced Geosciences, Inc., Austin, TX (US)

(72) Inventor: Bo Berglund, Jarfalla (SE)

(73) Assignee: Advanced Geosciences, Inc., Austin, TX (US)

( * ) Notice: Subject to any disclaimer, the term of this patent is extended or adjusted under 35 U.S.C. 154(b) by 240 days.

(21) Appl. No.: 14/855,241

(22) Filed: Sep. 15, 2015

(65) Prior Publication Data

US 2016/0005556 A1    Jan. 7, 2016

Related U.S. Application Data

(63) Continuation of application No. PCT/US2014/029013, filed on Mar. 14, 2014.

(60) Provisional application No. 61/787,586, filed on Mar. 15, 2013.

(51) Int. Cl.
*G01V 3/02* (2006.01)
*H01H 9/54* (2006.01)
*H03K 17/06* (2006.01)

(52) U.S. Cl.
CPC .............. *G01V 3/02* (2013.01); *H01H 9/542* (2013.01); *H01H 9/548* (2013.01); *H03K 17/06* (2013.01)

(58) Field of Classification Search
CPC . G01V 3/02; G01V 3/04; H01H 9/541; H01H 9/542; H01H 9/544; H01H 9/548; H01H 9/56; H03K 17/06
USPC ......................................... 307/112, 113, 115
See application file for complete search history.

(56) References Cited

U.S. PATENT DOCUMENTS 3,984,759 A    10/1976  St-Amant et al.
2014/0117776 A1*  5/2014  Gambach ............... H01H 9/541
                                                                307/113

FOREIGN PATENT DOCUMENTS

FR           2794890 A1    12/2000
WO    WO 2011/034140 A1    3/2011

OTHER PUBLICATIONS

PCT International Search Report dated Jun. 26, 2014; PCT/US2014/029013; 3 pages (search report of the EPO in counterpart international application submitted in satisfaction of the concise statement relevance requirement for non-English language documents. See MPEP 609.04(a)(III).)

* cited by examiner

*Primary Examiner* — William Hernandez
(74) *Attorney, Agent, or Firm* — Haynes and Boone, LLP

(57) ABSTRACT

A high power switching circuit suitable for injection of high currents, typically several tens of Amperes, at high drive voltages of up to 5-10 kV, is provided using a combination of electromechanical and semiconductor switching elements that, while providing switchable polarity, substantially bypasses semiconductor switching element(s) during a substantial portion of current injection duty cycles. In this way, thermal heating of switching elements can be reduced/managed in a way that improves long term reliability of geophysical survey equipment. In addition, circuit protections can be provided to address backflow currents generated upon collapse of electromagnetic fields in inductive loads, such as is typical in geophysical surveys.

30 Claims, 5 Drawing Sheets

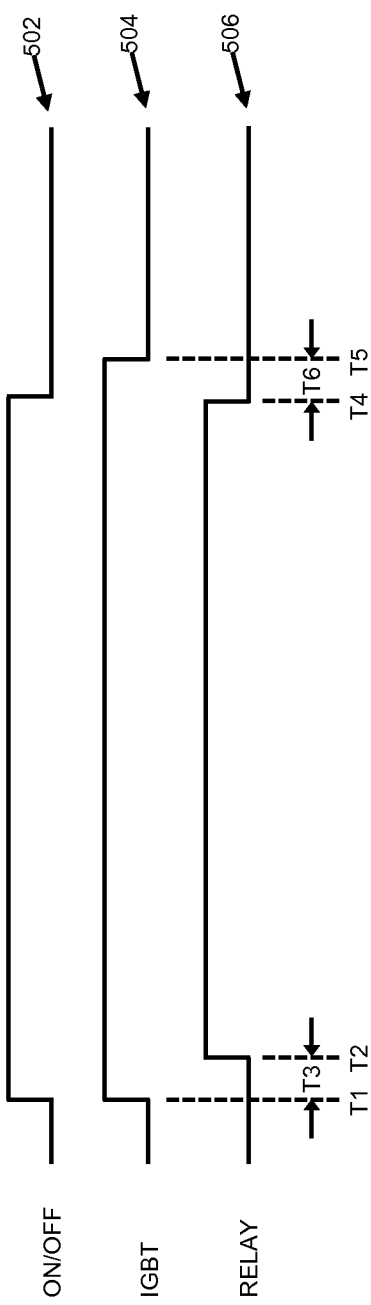

HIGH POWER CURRENT SWITCH

CROSS REFERENCE TO RELATED APPLICATIONS

This application is a continuation of International Application No. PCT/US2014/029013, designating the United States and filed Mar. 14, 2014, which in turn claims the benefit of U.S. provisional Application No. 61/787,586, filed Mar. 15, 2013, each of which is incorporated herein by reference.

BACKGROUND

Field of the Invention

The present disclosure generally relates to circuit protection techniques for switching circuits suitable for use in high power current injection devices for geophysical measurements and, in more particular embodiments to techniques that facilitate precisely timed current transitions without degradation and failure of switching circuits in ruggedized field equipment.

Description of the Related Art

High-power current injection devices (or transmitters) have long been used for current injection for resistivity and/or induced polarization imaging of geophysical structures. Examples include the PowerSting™ series of external high power transmitters (5 kW, 10 kW, and 15 kW) for use with SuperSting® R8/IP/SP and SuperSting® R1/IP/SP instruments, all available from Advanced Geosciences, Inc., Austin, Tex. Because geophysical surveys performed with such devices typically involve considerable investments of time/resources and are often conducted in remote locations under potentially adverse environmental conditions, ruggedness and reliability of devices including high power current injection devices is important. Accordingly, improved high power circuit protection devices and solutions are desired.

SUMMARY

It has been discovered that a high power switching circuit suitable for injection of high currents, typically several tens of Amperes, at high drive voltages of up to 5-10 kV, may be provided using a combination of electromechanical and semiconductor switching elements that, while providing switchable polarity, substantially bypasses semiconductor switching element(s) during a substantial portion of current injection duty cycles. In this way, thermal heating of switching elements can be reduced or managed in a way that improves long term reliability of geophysical survey equipment. In addition, circuit protections can be provided to address backflow currents generated upon collapse of electromagnetic fields in inductive loads, such as may be encountered in geophysical surveys. While the developed designs and techniques have applicability to geophysical survey equipment, it will be understood that such designs and techniques also have applicability to other high-power switching applications.

In some embodiments in accordance with the present inventions, a current injection device for geophysical measurements includes (i) an H-bridge circuit that includes four (4) electromechanical switching elements, (ii) a semiconductor switching element and (iii) a electromechanical switching element. The H-bridge circuit is configured to, for at least some modes of operation, switchably control polarity of current injection into a geophysical load. The four (4) electromechanical switching elements of the H-bridge are coupled in series-connected pairs between first and second high voltage terminals. The semiconductor switching element is coupled between the H-bridge circuit and the first high voltage terminal. The fifth electromechanical switching element is coupled, in parallel with the semiconductor switching element, between the H-bridge circuit and the first high voltage terminal. The fifth electromechanical switching element is coupled to a control circuit that ensures that state of the fifth electromechanical switching element is changed only when the semiconductor switching element is in a conductive state.

In some embodiments, the semiconductor switching element is capable of passing a working load current of at least 15 A while conducting and capable of blocking a supply voltage at least 4 kV when not conducting.

In some embodiments, the current injection device further includes a high voltage power supply. The high voltage power supply drives a supply voltage of at least 4 kV and is capable of supplying the working load current of at least 15 A for injection into a geophysical load. In some cases or embodiments, for a substantial entirety of a current injection duty cycle, the working load current passes through respective electromechanical switching elements of the current injection device and substantially bypasses the semiconductor switching element thereof.

In some cases or embodiments, the current injection duty cycle is between about 100 ms and 50 s, and the working load current substantially bypasses the semiconductor switching element, passing instead through the fifth electromechanical switching element, during a substantial entirety of the current injection duty cycle.

In some cases or embodiments, the current injection duty cycle is at least about 100 ms and the working load current substantially bypasses the semiconductor switching element, passing instead through the fifth electromechanical switching element, during at least 40% of the current injection duty cycle. In some cases or embodiments, the current injection duty cycle is preferably at least about 1000 ms and the working load current substantially bypasses the semiconductor switching element, passing instead through the fifth electromechanical switching element, during at least 94% of the current injection duty cycle. In some cases or embodiments, the current injection duty cycle is still more preferably about 2000 ms and the working load current substantially bypasses the semiconductor switching element, passing instead through the fifth electromechanical switching element, during at least 99% of the current injection duty cycle.

In some cases or embodiments, a substantial entirety of the working load current passes through the semiconductor switching element only (i) during an initial portion of the current injection duty cycle that coincides substantially with relay closing time and (ii) during a final portion of the current injection duty cycle that that is defined by the control circuit.

In some cases or embodiments, the electromechanical switching elements of the current injection device, when in a closed state, exhibit essentially negligible voltage drop thereacross and correspondingly negligible thermal heating when passing the working load current. The semiconductor switching element, while transiently carrying working load current just prior to and just after a state change of the fifth electromechanical switching element, exhibits a non-negligible voltage drop thereacross and corresponding thermal heating, but only for transient periods of less than about 20 ms.

In some cases or embodiments, the control circuit precisely times turn off of the fifth electromechanical switching element and thereby provides, in at least some modes of operation, a temporal reference for the geophysical measurements. In some cases or embodiments, the control circuit is calibratable in-field to ascertain for a current geophysical survey or measurement thereof, precise timing of the turn off of the current injection into the geophysical load.

In some embodiments, the current injection device further includes a communications interface to report timing information based on calibration of the control circuit. In some embodiments, the current injection device further includes a communications interface to receive a precise timing directive to which the calibrated control circuit and timing of the turn off of the current injection into the geophysical load are conformed.

In some cases or embodiments, for at least some modes of measurements include induced polarization measurement, and the geophysical load is an inductive load.

In some embodiments, the current injection device further includes a transient voltage suppression (TVS) circuit coupled in parallel with the H-bridge between the first and second high voltage terminals. The TVS circuit includes a series-connected high voltage blocking diode to block supply current flow, but pass back current associated with field collapse in the geophysical load.

In some cases or embodiments, the semiconductor switching element includes an insulated gate bipolar transistor (IGBT). In some embodiments, the current injection device further includes an optoisolator coupled between the control circuit and a gate of the semiconductor switching element. The optoisolator provides electric isolation to protect the semiconductor switch element from voltage surges, transients, or other such perturbations that may originate from a power supply, from a control and safety circuit (as discussed below), or that may be due to lightning, electrostatic discharge (ESD), radio frequency (RF) transmissions, or various other sources. In some cases or embodiments, the electromechanical switches include high power relays.

In some cases or embodiments, the control circuit further ensures that states of the four electromechanical switches of the H-bridge are changed only when the semiconductor switching element is in a non-conductive state and the fifth electromechanical switch is in an open state.

In some embodiments in accordance with the present invention, a circuit protection method includes: (i) in a current injection device for geophysical measurements, controllably switching polarity of a working load current using an H-bridge of four (4) electromechanical switching elements; (ii) in a current injection device, precisely controlling turn-on and turn-off timing of the injection of the working load current into a geophysical load using a semiconductor switching element capable of passing the working load current while conducting and blocking the supply voltage when not conducting; and (iii) phasing closing and opening of a fifth electromechanical switching element coupled, in parallel with the semiconductor switching element, between the H-bridge circuit and a high voltage supply terminal, such that for a substantial entirety of a duty cycle of the working load current injection, the working load current passes through respective electromechanical switching elements of the current injection device and substantially bypasses the semiconductor switching element thereof.

In some embodiments, the device for geophysical measurements, controllably switching polarity of the working load current of at least 15 A delivered from a supply voltage at least 4 kV using the H-bridge of four (4) electromechanical switching elements.

In some cases or embodiments, the current injection duty cycle is preferably between about 100 ms and 50 s, and the method further includes during a substantial entirety of the current injection duty cycle, substantially bypassing the semiconductor switching element and instead passing the working load current through the fifth electromechanical switching element.

In some cases or embodiments, the current injection duty cycle is at least about 100 ms, and the method further includes substantially bypassing the semiconductor switching element during at least 40% of the current injection duty cycle, and instead passing the working load current through the fifth electromechanical switching element. In some cases or embodiments, the current injection duty cycle is preferably at least about 1000 ms, and the method further includes substantially bypassing the semiconductor switching element during at least 94% of the current injection duty cycle, and instead passing the working load current through the fifth electromechanical switching element. In some cases or embodiments, the current injection duty cycle is still more preferably about 2000 ms, and the method further includes substantially bypassing the semiconductor switching element during at least 99% of the current injection duty cycle, and instead passing the working load current through the fifth electromechanical switching element.

In some embodiments, the circuit protection method further includes passing a substantial entirety of the working load current through the semiconductor switching element only (i) during an initial portion of the current injection duty cycle that coincides substantially with relay closing time and (ii) during a final portion of the current injection duty cycle that that is defined by the control circuit. In some embodiments, the circuit protection method further includes dissipating essentially negligible power across the electromechanical switching elements of the current injection device, when in closed states and correspondingly generating essentially negligible thermal heating when passing the working load current, and transiently carrying working load current using the semiconductor switching element just prior to and just after a state change of the fifth electromechanical switching element, the semiconductor switching element exhibiting a non-negligible voltage drop thereacross and corresponding thermal heating, but only for transient periods of less than about 20 ms.

In some embodiments, the circuit protection method further includes precisely timing turn off of the fifth electromechanical switching element and thereby providing, in at least some modes of operation, a temporal reference for the geophysical measurements. In some embodiments, the circuit protection method further includes calibrating timing of a control circuit in-field to ascertain, for a current geophysical survey or measurement thereof, precise timing of the turn off of the working load current injection into the geophysical load.

BRIEF DESCRIPTION OF THE DRAWINGS

FIG. 5 is a timing diagram illustrating temporal aspects of the operation of the high-power current injection device of FIGS. 2 and 3.

DETAILED DESCRIPTION

Figure 1:
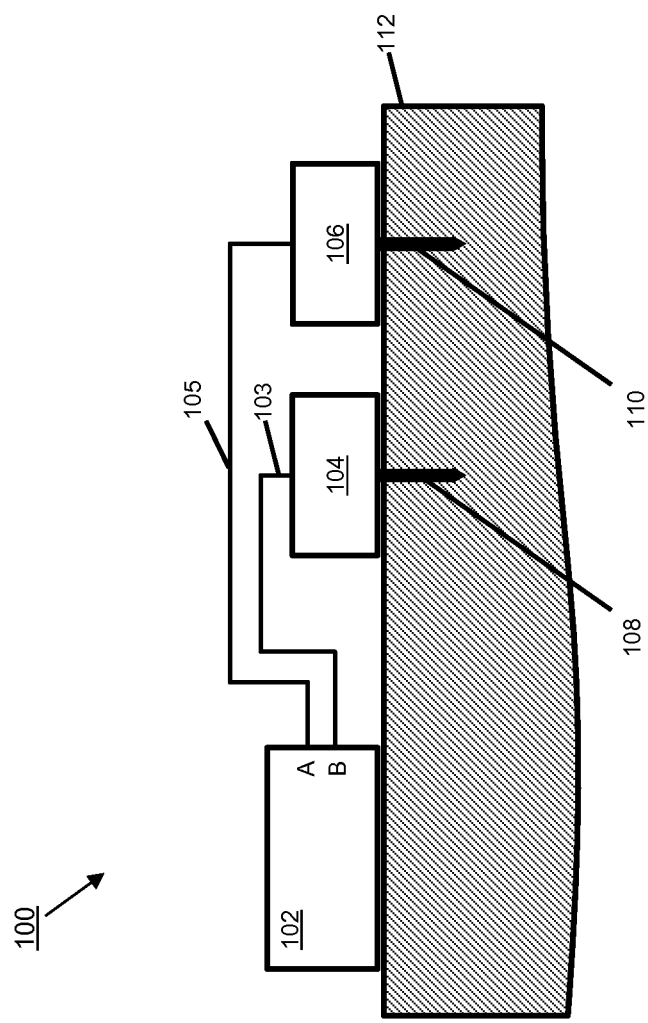
FIG. 1 is a block diagram of an example geophysical survey system including a plurality of probes connected to a survey controller according to some embodiments.

There is disclosed herein a protected switching circuit for use in high power current injection devices (or transmitters) such as for resistivity and induced polarization (IP) type geophysical measurements. In particular, the high power switch described herein is suitable for switching high currents (several tens of amperes) at high drive voltages (up to 5-10 kV), using a relay in parallel with a semiconductor switch element, in electrical power transmitters used for, but not necessarily limited to, geophysical measuring equipment. In particular, the high power switch provides protection for semiconductor switch elements such that high currents pass through a parallel low resistance path (relay) during a current injection duty cycle, creating a low standing voltage in the switching element. During a current switch-off phase, the current is diverted into a higher resistance path (semiconductor switch element) for a very short time after the low resistance switching element (relay) is open. Once the relay is fully open, the semiconductor switch element, which has a very precise current switch-off time capability, opens electronically to completely shut-off the current. In embodiments described herein, a "kickback" voltage that may be induced (based on an inductive load) when the current is completely shut-off is absorbed by transient voltage absorbers.

In high power current switches of the type described herein, current solutions suffer from a host of problems. For example, a pure electromechanical solution (relays) tends to suffer from problems of arcing in the relay contacts and time precision of the switch-off of current, which depends in part on the mechanical conditions of the relays. Arcing in electromechanical switching components such as relays can occur due to their low capability for handling DC load currents while switching off. The relay contacts typically open (separate) at a speed that is slow compared to the formation of a spark or even an arc, which wears down the contact elements. Such arcing may also adversely affect reliability of the power switch. Moreover, the arcing problem worsens as the working voltage increases. Relays also have a slow operating speed and response, which in conjunction with wear, degradation, or environmental variability may adversely affect time precision, due to the mechanical nature of the switching element. Such time imprecision, particularly occurring during the switch-off of current, can adversely affect quality of induced polarization measurements. As a result, improved techniques and designs are desired.

Use of a pure semiconductor solution (typically insulated-gate bipolar transistors, IGBTs, for voltages in the 5-10 kV range), for example in the high power current switches of the type described herein, tends to result in thermal degradation effects. For example, overheating of the conducting elements of a semiconductor device can lead to field failures of such devices. Large heat sinks are needed on the IGBTs in order to control heat dissipation, but may be only somewhat effective in extreme environmental conditions. IGBTs also suffer from low resistance to overvoltage above a specified max voltage, which can happen easily with inductive loads that are switched off. IGBTs are thus vulnerable to catastrophic failures caused by overvoltage transients, particularly while in the heated condition. Semiconductor switching components, such as IGBTs, also suffer from high power dissipation while working due to the high conduction voltage present while passing a high current. This power dissipation can heat up the semiconductor junctions in the component and thus deteriorate the switch. In some cases, quality of geophysical data may be adversely affected. As a result, improved techniques and designs are desired.

Embodiments described herein aim to address the shortcomings of both relay-only and semiconductor-only connections by mixing the two switching types in a particular design configuration that targets design goals of a high power current injection device (or transmitter) with operational modes to support induced polarization type geophysical measurements. In particular, a switching circuit is provided which uses a mechanical contact (relay), having an inherently low voltage drop while in a conducting state, in parallel with a much faster semiconductor switch element, having a sizeable conduction voltage. By configuring devices in this way, current from the semiconductor element is advantageously redirected to the relay contact as soon as the relay closes. Thus, conduction current that would otherwise contribute to heating of the semiconductor device during a current injection cycle is offloaded through the mechanical relay. It should be noted that the redirection of current from the semiconductor element to the relay, as described above, is controlled by the difference in resistance between the parallel high resistance (semiconductor element) and low resistance (relay) paths. Thus, current automatically redirects itself to the low resistance path upon closing the relay, without the need for control signals to initiate such current redirection. In embodiments described herein, the semiconductor device conducts the entire load current for a very short time interval at the beginning and/or end of the current injection cycle. In between current injection cycles, the semiconductor device will idle and conduct negligible current. As a result, the conduction voltage of the switching circuit is very small (well below 1V) and the power dissipated in the semiconductor element is negligible.

Additionally, by opening the relay prior to opening the semiconductor element (IGBT), it is possible to get a very well defined switch-off time when the IGBT is switched off. It should also be noted that by opening the relay prior to opening the semiconductor element, with the relay and IGBT in the parallel configuration described above, the voltage across the opening contacts of the relay will only rise to a value substantially equal to the conduction voltage of the IGBT, which is a low enough voltage to nullify the risk of arcing in the relay contacts. In many measurement situations, such as, but not limited to geophysical resistivity or induced polarization (IP) measurements, the sequence following the current switch-off is important. By utilizing the IGBT it is possible to create a very precise timing of switch-off of the injection current.

In addition to the foregoing features, other features and advantages will be understood by persons of ordinary skill in the art having benefit of the present description. In general, embodiments of the present invention(s) may be better understood, and its numerous objects, features, and advantages made apparent to those skilled in the art by referencing the accompanying drawings. The use of the same reference symbols in different drawings indicates similar or identical items.

Referring now to FIG. 1, an embodiment of a geophysical survey system 100 is illustrated. The geophysical survey system 100 includes a survey controller 102 and at least two survey probes 104 and 106. In the example of FIG. 1, survey probe 106 is connected to an output "A" of the survey controller 102 by a cable 105, and survey probe 104 is connected to an output "B" of the survey controller 102 by a cable 103. In some cases or embodiments, an integrated multiconductor cable may be provided with multiple take outs. The simplified illustration of FIG. 1 is merely illustrative and should not be taken as limiting. Additionally, the survey probe 104 includes an electrode 108, and the survey probe 106 includes an electrode 110. In some cases or embodiments, larger numbers of probes, more complex topologies, and different forms of connection (e.g., buried probes, borehole positioned probes, towed aquatic arrays, etc.) may be employed. Referring illustratively and without limitation, to FIG. 1, each of the illustrated electrodes 108/110 is inserted into the ground 112 to allow for measurement of an electrical property (e.g., apparent resistivity, resistance, induced polarization, self-potential, etc.) of the ground 112. In one example, an electrical stimulus (e.g., an injection current) may be provided by the survey controller 102 and transmitted through one of the cables 103/105 to one of the survey probes 104/106, and thus to one of the electrodes 108/110, whereby the other one of the electrodes 108/110 serves as a return path for the electrical stimulus.

While examples of embodiments of the geophysical survey system 100 are shown and discussed herein with application to terrestrial measurements, one of skill in the art will recognize that other measurement application environments (e.g., marine environments), as well as other components of the geophysical survey system 100 which have been omitted for clarity of discussion, may be included in the geophysical survey system 100 and will fall within the scope of the present disclosure. For example, while two survey probes 104, 106 are shown, the geophysical survey system 100 may include a sizable array of survey probes configured in a variety of array types including Schlumberger, Wenner alpha, Wenner beta, Wenner gamma, pole-pole, dipole-dipole, pole-dipole, equatorial dipole-dipole, or any combination thereof. Moreover, any of the survey probes included in such an array may be configured according to a particular operational mode such as a current injection configuration, a current return configuration, or a voltage sense configuration.

Figure 2:
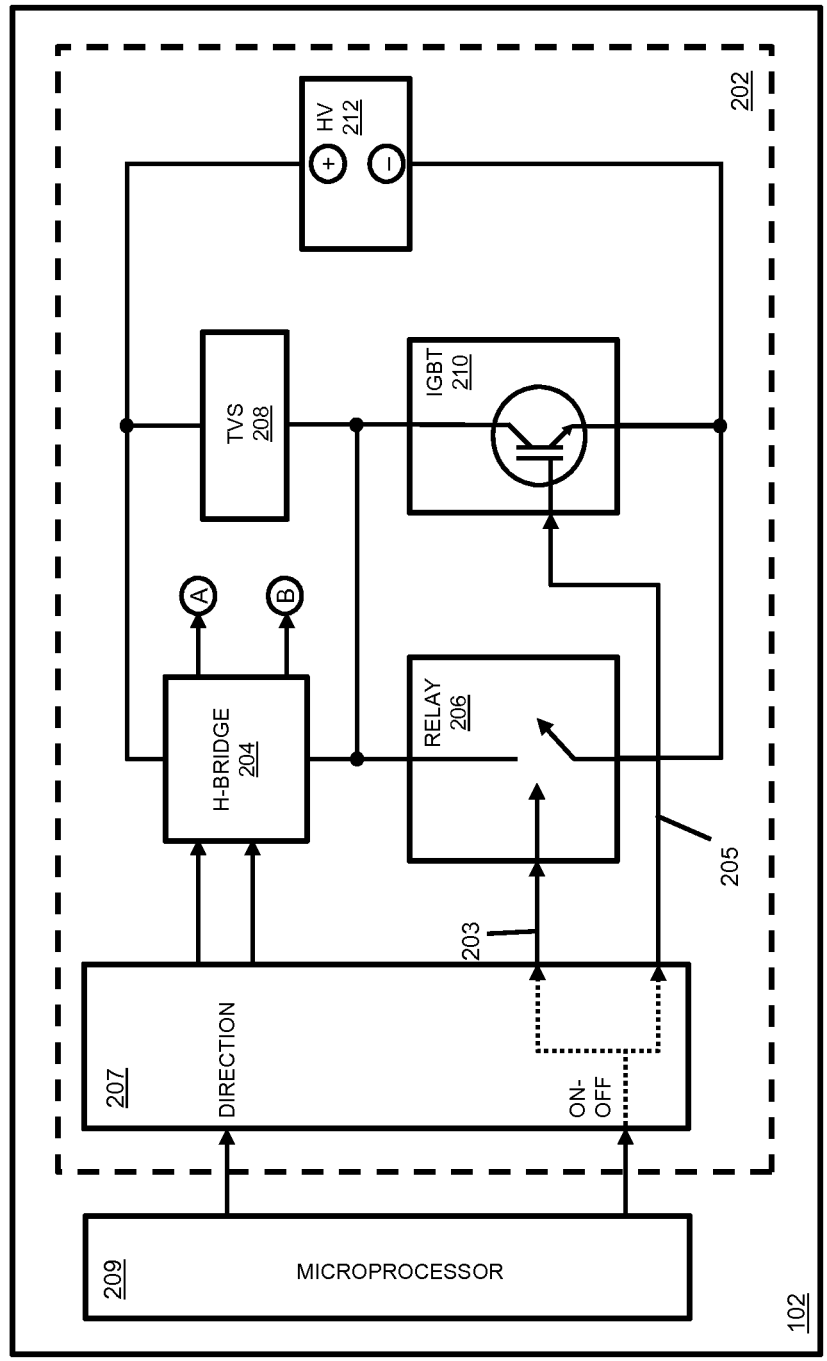
FIG. 2 is a block diagram of the survey controller of FIG. 1 including a high-power current injection device used in the geophysical survey system of FIG. 1 in accordance with some embodiments.

Referring now to FIG. 2, a block diagram of the survey controller 102 of FIG. 1 is illustrated, in accordance with some embodiments. In particular, the survey controller 102 includes a high-power current injection circuit 202 that provides protection for a semiconductor switch, as discussed below. The high-power current injection circuit 202 includes a semiconductor switch element 210, which is capable of passing a working load current while conducting and blocking a high drive supply voltage when not conducting. In various embodiments, the semiconductor switch element 210 includes an Insulated Gate Bipolar Transistor (IGBT). Control of the semiconductor switch element 210 is provided by a control and safety circuit 207, as illustrated by interconnect 205. Moreover, the control and safety circuit 207 receives inputs, for example, from a microprocessor 209, which in some embodiments is configured to execute a survey controller program stored in a local or remote memory location. In some examples, the survey controller program is configured to generate signals that are sent to the control and safety circuit 207 for controlling an ON/OFF state of the semiconductor switch element 210. Additionally, in some embodiments, the control and safety circuit 207 includes a dedicated gate drive circuit for control of the semiconductor switch element 210. Further, in various embodiments, an optoisolator may be coupled between the control and safety circuit 207 and a gate of the semiconductor switch element 210. The optoisolator provides electric isolation to protect the semiconductor switch element 210 from voltage surges, transients, or other such perturbations that may originate from a power supply, from the control and safety circuit 207, or that may be due to lightning, electrostatic discharge (ESD), radio frequency (RF) transmissions, or various other sources.

An electromechanical switching element 206, for example including a high power relay, is connected in parallel with the semiconductor switch element 210. The electromechanical switching element 206 is controlled by the control and safety circuit 207 coupled through interconnect 203. In particular, in some embodiments, the control and safety circuit 207 receives inputs from the microprocessor 209 executing the survey controller program configured to generate signals that are sent to the control and safety circuit 207 for controlling an ON/OFF state of the electromechanical switching element 206. In operation, the control and safety circuit 207 ensures that the electromechanical switching element 206 will not switch ON or OFF unless the semiconductor switch element 210 is in its conducting state. Thus, when the semiconductor switch element 210 is conducting, the voltage across the relay contacts will be limited to the conducting voltage of the semiconductor switch element 210, which in some embodiments is about 4-6 V. As discussed in more detail below, the electromechanical switching element 206 conducts high currents during a large majority of a current injection cycle, creating a low standing voltage in the switching element, and thereby protecting the semiconductor switch element 210.

Figure 3:
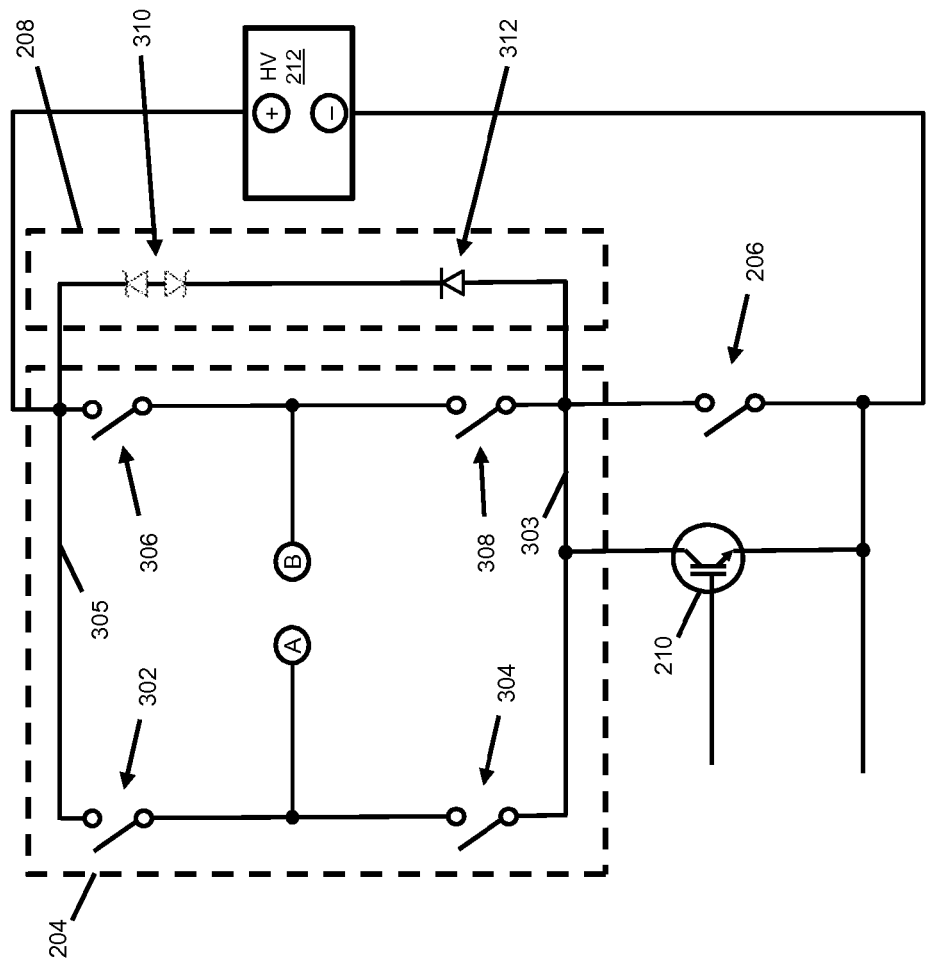
FIG. 3 is a circuit diagram illustrating switching elements of the high-power current injection device of FIG. 2 in accordance with some embodiments.
Figure 4:
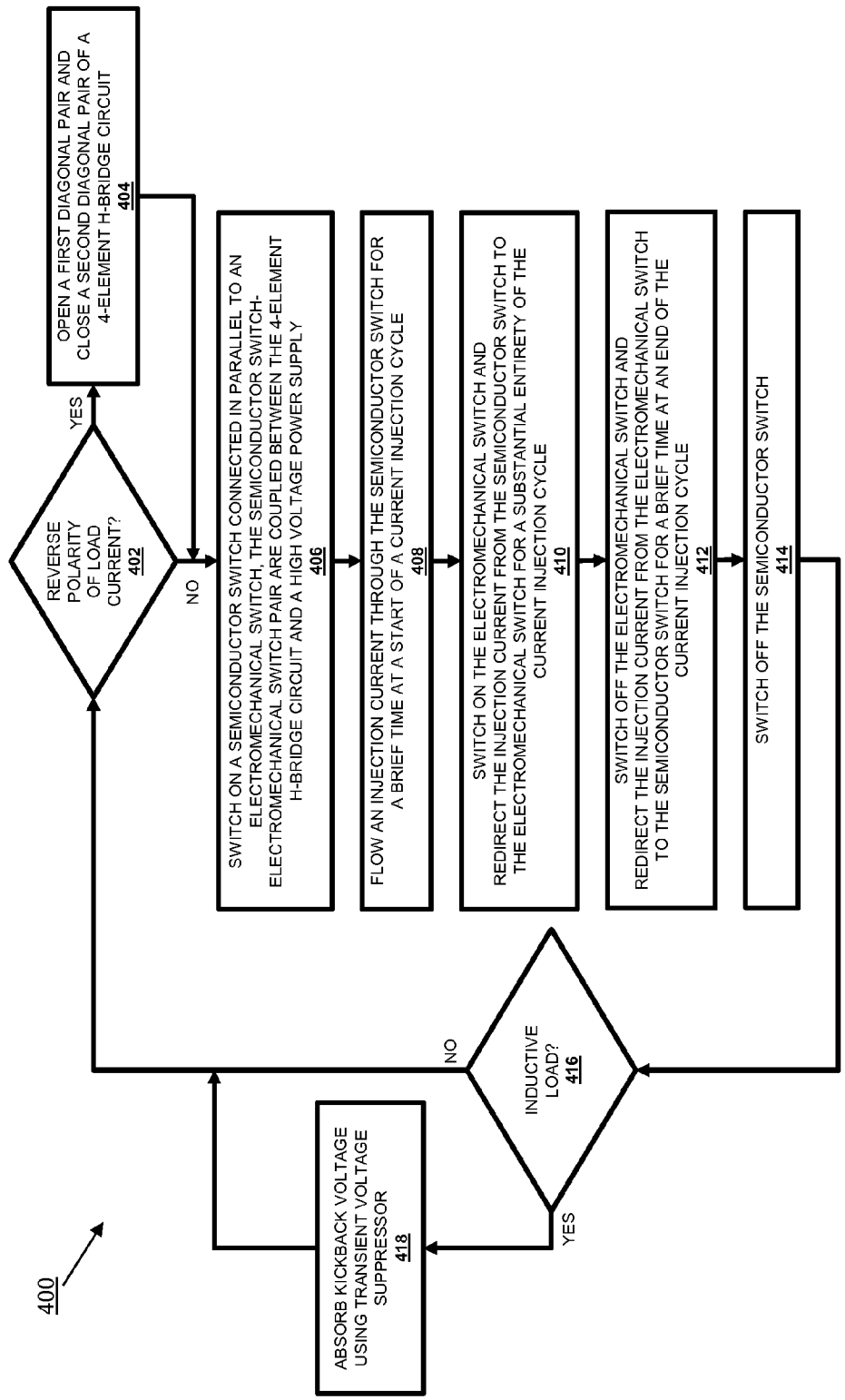
FIG. 4 is a flow chart illustrating an embodiment of a method for providing circuit protection in a geophysical survey system using the high-power current injection device of FIGS. 2 and 3.

Referring now to FIGS. 2 and 3, the high-power current injection circuit 202 further includes a 4-element H-bridge circuit 204 including 4 electromechanical switching elements (relays) connected in two series-connected pairs. As illustrated in FIG. 3, a left pair of electromechanical switching elements 302/304 are connected in series, with a connection to the output "A" of the survey controller 102 (recall FIGS. 1 and 2) coupled therebetween, and a right pair of electromechanical switching elements 306/308 are connected in series, with a connection to the output "B" of the survey controller 102 (recall FIGS. 1 and 2) coupled therebetween. In such a configuration, at a first end, electromechanical switching elements 304/308 connect to the high voltage end of the combination of the semiconductor switch element 210 and the electromechanical switching element 206 at a common node 303. Similarly, at a second end, electromechanical switching elements 302/306 connect to a high voltage power supply 212 by a common node 305. A geophysical load, such as the ground 112 (recall FIG. 1) connected to current injection electrodes 108/110 (recall FIG. 1), can be coupled between the two relay pairs series-connected contacts by way of the survey probe 106 connection to the output "A" of the survey controller 102 and the survey probe 104 connection to the output "B" of the survey controller 102. The 4-element H-bridge circuit 204 has three operating modes, as controlled by the control and safety circuit 207. In particular, in some embodiments, the control and safety circuit 207 receives inputs from the microprocessor 209 executing the survey controller program configured to generate signals that are sent to the control and safety circuit 207 for selecting one of the three operating modes for the 4-element H-bridge circuit 204.

In a first operation mode of the 4-element H-bridge circuit 204, all of the electromechanical switching elements 302/304/306/308 are in an OFF state. In this first mode, there is no output present at either the output "A" or the output "B" of the survey controller 102. In a second operation mode, a positive relay in the left pair of relays (electromechanical switching element 302) and a negative relay in the right pair of relays (electromechanical switching element 308) are in an ON state, while electromechanical switching elements 304/306 are in an OFF state. In this second mode, the A-B output of the survey controller 102 is positive. In a third operation mode, a negative relay in the left pair of relays (electromechanical switching element 304) and a positive relay in the right pair of relays (electromechanical switching element 306) are in an ON state, while electromechanical switching elements 302/308 are in an OFF state. In this third mode, the A-B output of the survey controller 102 is negative.

The control and safety circuit 207, as discussed above, controls the switch-ON and switch-OFF of both the semiconductor switch element 210 and the electromechanical switching element 206, as well as selection of one of the three operating modes for the 4-element H-bridge circuit 204. As illustrated in FIG. 2, the control and safety circuit 207 has one ON/OFF input that is creating two separate ON/OFF outputs, one for semiconductor switch element 210 and one for the parallel electromechanical switching element 206, such that a time separation is created for the operation of the switching elements, as discussed below with reference to FIG. 5. This ensures that electromechanical switching element 206 is only switched ON or OFF when the semiconductor switch element 210 is in its conducting state, thus guaranteeing low voltage conditions when the relay contacts (of the electromechanical switching element 206) open or close. For avoidance of doubt, although the control and safety circuit 207 is described as a circuit, it will be understood that the functionality thereof may be provided at least in part using programmable electronics at least partially under software or firmware control.

As shown in FIGS. 2 and 3, the high-power current injection circuit 202 also includes a transient voltage suppressor (TVS) circuit 208 connected between the high voltage power supply 212 and the high voltage end of the combination of the semiconductor switch element 210 and the electromechanical switching element 206 by the common node 303. The TVS circuit 208 suppresses kickback transient voltages that are created by inductive load components that may be connected to the output electrodes "A" and "B". The TVS circuit 208 is configured such that it primarily conducts during a voltage transient. As illustrated in FIG. 3, the TVS circuit 208 includes a bidirectional TVS diode 310 and a high voltage diode 312. During a kickback transient voltage suppression event, the TVS circuit 208 short circuits a transient voltage across the load and adds a reverse voltage to speed up the magnetic field decay across the load inductive component. In normal operation (i.e., when not suppressing a transient voltage), the TVS circuit 208 is isolated from the load by the high voltage diode 312, which is reverse-biased and has a low leakage current. In the configuration shown in FIG. 3, the bidirectional TVS diode 310 includes two series connected Zener diodes oriented in opposite directions. In such a configuration, a sizable reverse voltage (e.g., a few hundred volts) can be quickly created across the load to quickly discharge the magnetic field.

While an example of the TVS circuit 208 having specific components has been shown and described, it will be understood that alternative devices and methods for implementing a transient voltage suppressor circuit are envisioned as falling within the scope of the present disclosure. For example, in other embodiments, the TVS circuit 208 may include filters, crowbar devices, as well as alternative voltage-clamping devices such as selenium cells, silicon carbide varistors, metal-oxide varistors, a unidirectional Zener diode, or any combination thereof.

Referring now to FIGS. 2, 3, 4 and 5, an embodiment of a method 400 for providing circuit protection in a geophysical survey system, such as introduced in FIG. 1, using the high-power current injection circuit 202 is illustrated. In particular, the method 400 describes a timing and sequence related to operation of the high-power current injection circuit 202. The method 400 begins at a block 402 where a decision regarding whether to change a polarity of a load current is made. For example, as described above, when a diagonal pair that includes the electromechanical switching elements 302/308 of the 4-element H-bridge circuit 204 is in an ON state, the A-B output of the survey controller 102 is positive. Alternatively, when a diagonal pair that includes the electromechanical switching elements 304/306 of the 4-element H-bridge circuit 204 is in an ON state, the A-B output of the survey controller 102 is negative. At the block 402, if a decision is made to switch between a positive/negative polarity, or vice versa, at the A-B output of the survey controller 102, then the method proceeds to a block 404 where a first diagonal pair of electromechanical switching elements of the 4-element H-bridge circuit 204 is open (switched OFF) and a second diagonal pair is closed (switched ON). In some embodiments, the polarity of the A-B output of the survey controller 102 is reversed by the microprocessor 209 signaling the control and safety circuit 207 which then sets an operation mode the 4-element H-bridge circuit 204 in accordance with a selected polarity. To be sure, the control and safety circuit 207 also ensures that states of the four electromechanical switching elements 302/304/306/308 of the 4-element H-bridge circuit 204 are changed only when there is no current flowing in the circuit (i.e., when the semiconductor switch element 210 is in a non-conductive state and the electromechanical switching element 206 is in an open state). The method then proceeds to a block 406, as described below.

If at the block 402, a decision is made not to switch polarity at the A-B output of the survey controller 102, then the method proceeds directly to the block 406 where a semiconductor switch element is switched ON. In operation, an ON input received by the control and safety circuit 207 from the microprocessor 209 produces an ON output signal at the control and safety circuit 207 at a time T1, as shown in a row 502 of the timing diagram of FIG. 5. In response to the ON output signal from the control and safety circuit 207 at the time T1, the semiconductor switch element 210 is switched ON at the time T1, as shown in a row 504 of the timing diagram of FIG. 5, with a negligible time lag from when the ON output signal was received from the control and safety circuit 207. Thereafter, when the semiconductor switch element 210 is switched ON, the method 400 proceeds to a block 408 where an injection current flows through the semiconductor switch element 210 for a brief time at a start of a current injection cycle. In some embodiments, the semiconductor switch element 210 passes the full injection current for a time of less than about 20 milliseconds at the start of the current injection cycle.

The method then proceeds to a block 410 where the electromechanical switching element 206 is switched ON, and the current load is redirected to the electromechanical switching element 206. In one example, the ON output signal from the control and safety circuit 207 switches ON the electromechanical switching element 206 at a time T2, as shown in a row 506 of the timing diagram of FIG. 5, such that a time separation is created for the operation of the semiconductor switch element 210 and the electromechanical switching element 206. A lag time T3 between the switch ON time of the semiconductor switch element 210 and the electromechanical switching element 206, while not necessary for the circuit function, is caused by a mechanical delay in the actuation of the electromechanical switching element 206. In particular, the lag time T3 is dependent to a large extent on the mechanical characteristics of the electromechanical switching element 206, and it will be understood that various lag times T3 resulting from the use of different types of relays and relay drive circuits, are envisioned as falling within the scope of the present disclosure. During the lag time T3, the semiconductor switch element 210 may experience heating due to the high currents passing through it, however because of the short value of the time T3, after which the full current load is redirected to the electromechanical switching element 206, degradation of the semiconductor switch element 210 is substantially prevented. Thereafter, the electromechanical switching element 210 passes the injection current for a substantial entirety of the current injection cycle and until a time T4, as discussed below.

The method 400 proceeds to a block 412 where the electromechanical switching element 206 is switched OFF, and the current load is redirected to the semiconductor switch element 206. In operation, an OFF input received by the control and safety circuit 207 from the microprocessor 209 produces an OFF output signal at the control and safety circuit 207 at a time T4, as shown in the row 502 of the timing diagram of FIG. 5. In response to the OFF output signal from the control and safety circuit 207 at the time T4, the electromechanical switching element 206 is switched OFF at the time T4, as shown in a row 506 of the timing diagram of FIG. 5. For the sake of clarity in the discussion, any time lag from when the OFF output signal was received from the control and safety circuit 207 to when the electromechanical switching element 206 is switched OFF has not been illustrated. After fully switching OFF the electromechanical switching element 206, the injection current flows through the semiconductor switch element 210 for a brief time at an end of the current injection cycle. In some embodiments, the semiconductor switch element 210 passes the full injection current for a time of less than about 20 milliseconds at the end of the current injection cycle.

The method then proceeds to a block 414 where the control and safety circuit 207 switches OFF the semiconductor switching element 210 at a time T5, as shown in a row 504 of the timing diagram of FIG. 5. In some embodiments, a time separation T6 between switching OFF each of the electromechanical switching element 206 and the semiconductor switch element 210, which is controlled by the control and safety circuit 207, is longer than a full release time of the electromechanical switching element 206. In particular, controlling the electromechanical switching element 206 by way of the control and safety circuit 207 ensures that the state of the electromechanical switching element 206 is changed only when the semiconductor switch element 210 is in a conductive state, so as to prevent arcing in the relay contacts. Moreover, in some embodiments, the delay time T6 is added to a pulse time command to the control and safety circuit 207. Thus, the delay T6 is measured by the control circuitry and taken into account by the microprocessor 209 to yield an accurately controlled output pulse time on the output electrodes "A" and "B" of the survey controller 102 (FIG. 1).

The method 400 then proceeds to a block 416, where a presence of an inductive load is determined based on the presence of an induced transient "kickback" voltage, which may be triggered at the moment the semiconductor switch element 210 is switched OFF to completely shut OFF the injection current. At the block 416, if a transient voltage is detected, the method proceeds to a block 418, where the TVS circuit 208 suppresses the transient voltage and speeds up the magnetic field decay associated with the load inductive component, as discussed above. It should be noted that detection of transient voltages and the corresponding suppression by way of the TVS circuit 208, as described with reference to blocks 416 and 418, is an automatic process (i.e., not requiring additional circuit or control signals) triggered directly by the transient "kickback" voltage itself onto suppression components of the TVS circuit 208. Thereafter, the method returns to the block 402 where a decision regarding whether to change a polarity of a load current is made for a subsequent current injection cycle. Alternatively, if no transient voltage is detected at the block 416, the method proceeds directly to the block 402.

Thus, a system and method have been described which provide a protected switching circuit for use in high power current injection devices (or transmitters) such as for resistivity and induced polarization (IP) type geophysical measurements. By using a combination of electromechanical and semiconductor switching elements high injection currents substantially bypass semiconductor switching element (s) during a substantial portion of current injection duty cycles. Thereby, thermal heating of semiconductor switching elements can be reduced or managed in order to improve device performance and reliability. Additionally, TVS circuits can be provided to suppress transient kickback voltages which may occur when inductive loads are present.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A current injection device for geophysical measurements, the current injection device comprising:
  an H-bridge circuit configured to, for at least some modes of operation, switchably control a polarity of a current injection into a geophysical load, the H-bridge comprising four (4) electromechanical switching elements coupled in series-connected pairs between first and second high voltage terminals;
  a semiconductor switching element coupled between the H-bridge circuit and the first high voltage terminal; and
  a fifth electromechanical switching element coupled, in parallel with the semiconductor switching element, between the H-bridge circuit and the first high voltage terminal, the fifth electromechanical switching element coupled to a control circuit that ensures that a state of the fifth electromechanical switching element is changed only when the semiconductor switching element is in a conductive state.

2. The current injection device, as recited in claim 1, wherein the semiconductor switching element is capable of passing a working load current of at least 15 A while conducting and capable of blocking a supply voltage of at least 4 kV when not conducting.

3. The current injection device, as recited in claim 1, further comprising:
a high voltage power supply, the high voltage power supply with a supply voltage of at least 4 kV and capable of supplying a working load current of at least 15 A for injection into the geophysical load.

4. The current injection device, as recited in claim 1, wherein for a substantial entirety of a current injection duty cycle, a working load current passes through respective electromechanical switching elements of the current injection device and substantially bypasses the semiconductor switching element thereof.

5. The current injection device, as recited in claim 1, wherein a current injection duty cycle is between 100 ms and 50 s, and wherein a working load current substantially bypasses the semiconductor switching element, passing instead through the fifth electromechanical switching element, during a substantial entirety of the current injection duty cycle.

6. The current injection device, as recited in claim 1, wherein a current injection duty cycle is at least 100 ms and a working load current substantially bypasses the semiconductor switching element, passing instead through the fifth electromechanical switching element, during at least 40% of the current injection duty cycle.

7. The current injection device, as recited in claim 6, wherein the current injection duty cycle is preferably at least 1000 ms and the working load current substantially bypasses the semiconductor switching element, passing instead through the fifth electromechanical switching element, during at least 94% of the current injection duty cycle.

8. The current injection device, as recited in claim 7, wherein the current injection duty cycle is still more preferably 2000 ms and the working load current substantially bypasses the semiconductor switching element, passing instead through the fifth electromechanical switching element, during at least 99% of the current injection duty cycle.

9. The current injection device, as recited in claim 1, wherein a substantial entirety of a working load current passes through the semiconductor switching element only (i) during an initial portion of a current injection duty cycle that coincides substantially with a closing of a relay and (ii) during a final portion of the current injection duty cycle that that is defined by the control circuit.

10. The current injection device, as recited in claim 1, wherein the electromechanical switching elements of the current injection device, when in a closed state, exhibit essentially negligible voltage drop thereacross and correspondingly negligible thermal heating when passing a working load current, and
wherein the semiconductor switching element, while transiently carrying the working load current just prior to and just after a state change of the fifth electromechanical switching element, exhibits a non-negligible voltage drop thereacross and corresponding thermal heating, but only for transient periods of less than 20 ms.

11. The current injection device, as recited in claim 1, wherein the control circuit precisely times turn off of the fifth electromechanical switching element and thereby provides, in at least some modes of operation, a temporal reference for the geophysical measurements.

12. The current injection device, as recited in claim 11, wherein the control circuit is calibratable in-field to ascertain for a current geophysical survey or measurement thereof, precise timing of the turn off of the current injection into the geophysical load.

13. The current injection device, as recited in claim 12, further comprising:
a communications interface to report timing information based on calibration of the control circuit.

14. The current injection device, as recited in claim 12, further comprising:
a communications interface to receive a precise timing directive to which the calibrated control circuit and timing of the turn off of the current injection into the geophysical load are conformed.

15. The current injection device, as recited in claim 1, wherein, for at least some modes of operation, the geophysical measurements include induced polarization measurement, and
wherein the geophysical load is an inductive load.

16. The current injection device, as recited in claim 1, further comprising:
a transient voltage suppression (TVS) circuit coupled in parallel with the H-bridge between the first and second high voltage terminals, the TVS circuit including a series-connected high voltage blocking diode to block supply current flow, but pass back current associated with field collapse in the geophysical load.

17. The current injection device, as recited in claim 1, wherein the semiconductor switching element includes an insulated gate bipolar transistor (IGBT).

18. The current injection device, as recited in claim 1, further comprising:
an optoisolator coupled between the control circuit and a gate of the semiconductor switching element.

19. The current injection device, as recited in claim 1, wherein the electromechanical switching elements include high power relays.

20. The current injection device, as recited in claim 1, wherein the control circuit further ensures that states of the four electromechanical switching elements of the H-bridge are changed only when the semiconductor switching element is in a non-conductive state and the fifth electromechanical switching element is in an open state.

21. A circuit protection method comprising:
in a current injection device for geophysical measurements, controllably switching a polarity of a working load current using an H-bridge of four (4) electromechanical switching elements;
in the current injection device, precisely controlling turn-on and turn-off timing of the injection of the working load current into a geophysical load using a semiconductor switching element capable of passing the working load current while conducting and blocking a supply voltage when not conducting; and
phasing closing and opening of a fifth electromechanical switching element coupled, in parallel with the semiconductor switching element, between the H-bridge circuit and a high voltage supply terminal, such that for a substantial entirety of a duty cycle of the working load current injection, the working load current passes through respective electromechanical switching elements of the current injection device and substantially bypasses the semiconductor switching element thereof.

22. The circuit protection method of claim 21, further comprising:
   in the current injection device for geophysical measurements, controllably switching the polarity of the working load current of at least 15 A delivered from the supply voltage of at least 4 kV using the H-bridge of four (4) electromechanical switching elements.

23. The circuit protection method of claim 21,
   wherein the working load current injection duty cycle is preferably between 100 ms and 50 s; and
   further comprising during a substantial entirety of the working load current injection duty cycle, substantially bypassing the semiconductor switching element and instead passing the working load current through the fifth electromechanical switching element.

24. The circuit protection method of claim 21,
   wherein the working load current injection duty cycle is at least 100 ms; and further comprising during at least 40% of the working load current injection duty cycle, substantially bypassing the semiconductor switching element and instead passing the working load current through the fifth electromechanical switching element.

25. The circuit protection method of claim 21,
   wherein the working load current injection duty cycle is preferably at least 1000 ms; and
   further comprising during at least 94% of the working load current injection duty cycle, substantially bypassing the semiconductor switching element and instead passing the working load current through the fifth electromechanical switching element.

26. The circuit protection method of claim 21,
   wherein the working load current injection duty cycle is still more preferably 2000 ms; and
   further comprising during at least 99% of the working load current injection duty cycle, substantially bypassing the semiconductor switching element and instead passing the working load current through the fifth electromechanical switching element.

27. The circuit protection method of claim 21, further comprising:
   passing a substantial entirety of the working load current through the semiconductor switching element only (i) during an initial portion of the working load current injection duty cycle that coincides substantially with a closing of a relay and (ii) during a final portion of the working load current injection duty cycle that that is defined by a control circuit.

28. The circuit protection method of claim 21, further comprising:
   dissipating essentially negligible power across the electromechanical switching elements of the current injection device, when in closed states and correspondingly generating essentially negligible thermal heating when passing the working load current, and
   transiently carrying working load current using the semiconductor switching element just prior to and just after a state change of the fifth electromechanical switching element, the semiconductor switching element exhibiting a non-negligible voltage drop there across and corresponding thermal heating, but only for transient periods of less than 20 ms.

29. The circuit protection method of claim 21, further comprising:
   precisely timing turn off of the fifth electromechanical switching element and thereby providing, in at least some modes of operation, a temporal reference for the geophysical measurements.

30. The circuit protection method of claim 29, further comprising:
   calibrating timing of a control circuit in-field to ascertain, for a current geophysical survey or measurement thereof, precise timing of the turn off of the working load current injection into the geophysical load.

* * * * *